United States Patent
Hung et al.

(10) Patent No.: US 10,058,006 B2
(45) Date of Patent: Aug. 21, 2018

(54) LEVER RELEASE MECHANISM FOR INFORMATION HANDLING SYSTEM CHASSIS SLED

(71) Applicant: Dell Products L.P., Round Rock, TX (US)

(72) Inventors: Hsiang-Yin Hung, Taipei (TW); Chi-Feng Lee, Taipei (TW); Timothy C. Dearborn, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/372,007

(22) Filed: Dec. 7, 2016

(65) Prior Publication Data

US 2018/0160563 A1    Jun. 7, 2018

(51) Int. Cl.
| | | |
|---|---|---|
| H05K 7/14 | (2006.01) | |
| G05G 1/08 | (2006.01) | |
| H05K 7/18 | (2006.01) | |
| H05K 5/02 | (2006.01) | |

(52) U.S. Cl.
CPC ............ *H05K 7/1489* (2013.01); *G05G 1/08* (2013.01); *H05K 5/0221* (2013.01); *H05K 7/1487* (2013.01); *H05K 7/18* (2013.01)

(58) Field of Classification Search
None
See application file for complete search history.

(56) References Cited

U.S. PATENT DOCUMENTS

| | | | | | |
|---|---|---|---|---|---|
| 5,481,431 | A  * | 1/1996 | Siahpolo | ................. | G06F 1/184 361/679.31 |
| 6,067,225 | A  * | 5/2000 | Reznikov | ............. | G11B 33/122 312/223.2 |
| 6,171,120 | B1 * | 1/2001 | Bolich | ............. | H01R 13/62933 361/679.4 |
| 6,288,902 | B1 * | 9/2001 | Kim | ....................... | G11B 33/08 206/701 |
| 6,356,441 | B1 * | 3/2002 | Claprood | ................ | G06F 1/184 312/332.1 |
| 6,490,153 | B1 * | 12/2002 | Casebolt | ................. | G06F 1/184 361/679.33 |
| 6,774,808 | B1 * | 8/2004 | Hibbs | ..................... | G06F 1/184 340/686.4 |
| 7,344,394 | B1 * | 3/2008 | Barina | .................... | G06F 1/183 361/755 |
| 7,477,511 | B2 * | 1/2009 | Hsu | ........................ | G11B 33/12 361/679.37 |
| 7,483,268 | B1 * | 1/2009 | King, Jr. | ................. | G06F 1/187 248/682 |

(Continued)

*Primary Examiner* — Xanthia C Cunningham
(74) *Attorney, Agent, or Firm* — Jackson Walker L.L.P.

(57) ABSTRACT

A chassis sled for carrying information handling resources may include a sled housing, a lever mechanically coupled to the sled housing and for aiding a user in engaging the chassis sled with and disengaging the chassis sled from a chassis, and a lever release mechanism mechanically coupled to the lever and the sled housing. The lever release mechanism may be configured to facilitate rotatable translation of the lever relative to the sled housing between a closed position and an open position and vice versa and in the closed position, slidably translate the lever between an unsecured position and a secured position and vice versa.

18 Claims, 6 Drawing Sheets

(56) References Cited

U.S. PATENT DOCUMENTS

| | | | | |
|---|---|---|---|---|
| 7,583,497 B2* | 9/2009 | Roesner | G06F 1/184 | 361/679.33 |
| 8,369,080 B2* | 2/2013 | Huang | G06F 1/187 | 361/679.37 |
| 8,369,094 B2* | 2/2013 | McLean | H05K 7/1409 | 361/747 |
| 8,432,670 B2* | 4/2013 | Chen | G11B 33/124 | 361/679.02 |
| 8,498,104 B2* | 7/2013 | Lin | G11B 33/128 | 312/223.2 |
| 8,582,287 B2* | 11/2013 | Nguyen | G11B 33/124 | 211/126.6 |
| 8,641,313 B1* | 2/2014 | Crippen | H05K 5/0221 | 361/679.39 |
| 9,122,458 B2* | 9/2015 | Yu | G06F 1/185 | |
| 9,253,914 B2* | 2/2016 | Demange | H05K 7/1487 | |
| 9,674,978 B2* | 6/2017 | Wu | G06F 1/185 | |
| 2010/0134987 A1* | 6/2010 | Furholzer | H02B 1/052 | 361/747 |
| 2013/0099640 A1* | 4/2013 | Hu | G06F 1/187 | 312/223.2 |
| 2014/0084764 A1* | 3/2014 | Doglio | H05K 7/1489 | 312/223.2 |
| 2014/0187068 A1* | 7/2014 | Chia | H05K 7/1489 | 439/160 |
| 2014/0233182 A1* | 8/2014 | Demange | H05K 7/1409 | 361/679.58 |
| 2014/0254106 A1* | 9/2014 | Baquiano | H05K 5/0221 | 361/726 |
| 2015/0069895 A1* | 3/2015 | Tahara | G03G 21/1633 | 312/319.1 |
| 2015/0070858 A1* | 3/2015 | Wu | H05K 7/1409 | 361/754 |
| 2015/0146372 A1* | 5/2015 | French, Jr. | H05K 7/1489 | 361/679.58 |
| 2016/0042768 A1* | 2/2016 | Yang | G11B 33/128 | 403/322.4 |
| 2016/0165743 A1* | 6/2016 | Milligan | H05K 7/1489 | 361/679.31 |
| 2016/0261083 A1* | 9/2016 | Chu | H01R 43/205 | |
| 2017/0055360 A1* | 2/2017 | Della Fiora | H05K 7/1487 | |
| 2017/0079156 A1* | 3/2017 | Hsiao | H05K 7/1489 | |
| 2017/0202084 A1* | 7/2017 | Wavering | H05K 1/141 | |
| 2017/0202099 A1* | 7/2017 | Nguyen | H05K 5/0221 | |

* cited by examiner

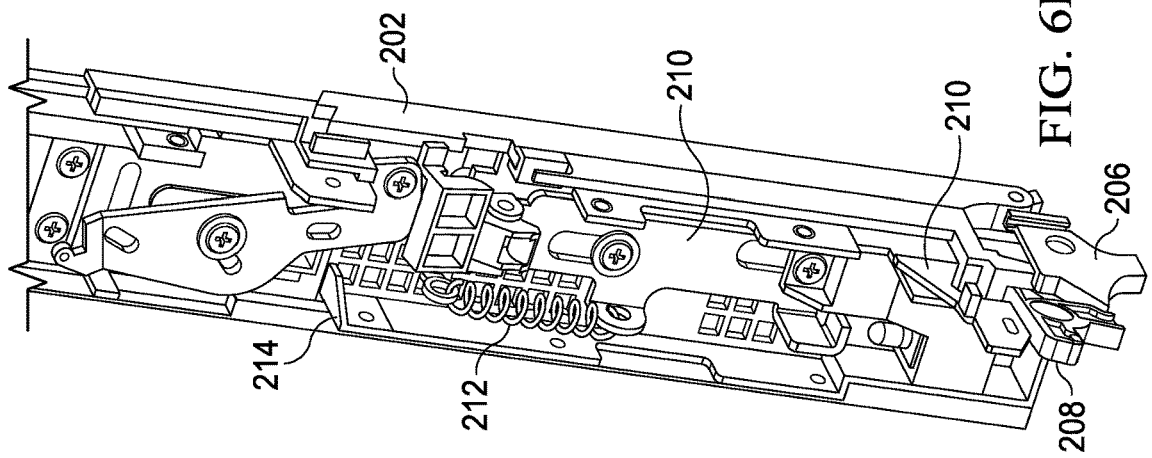
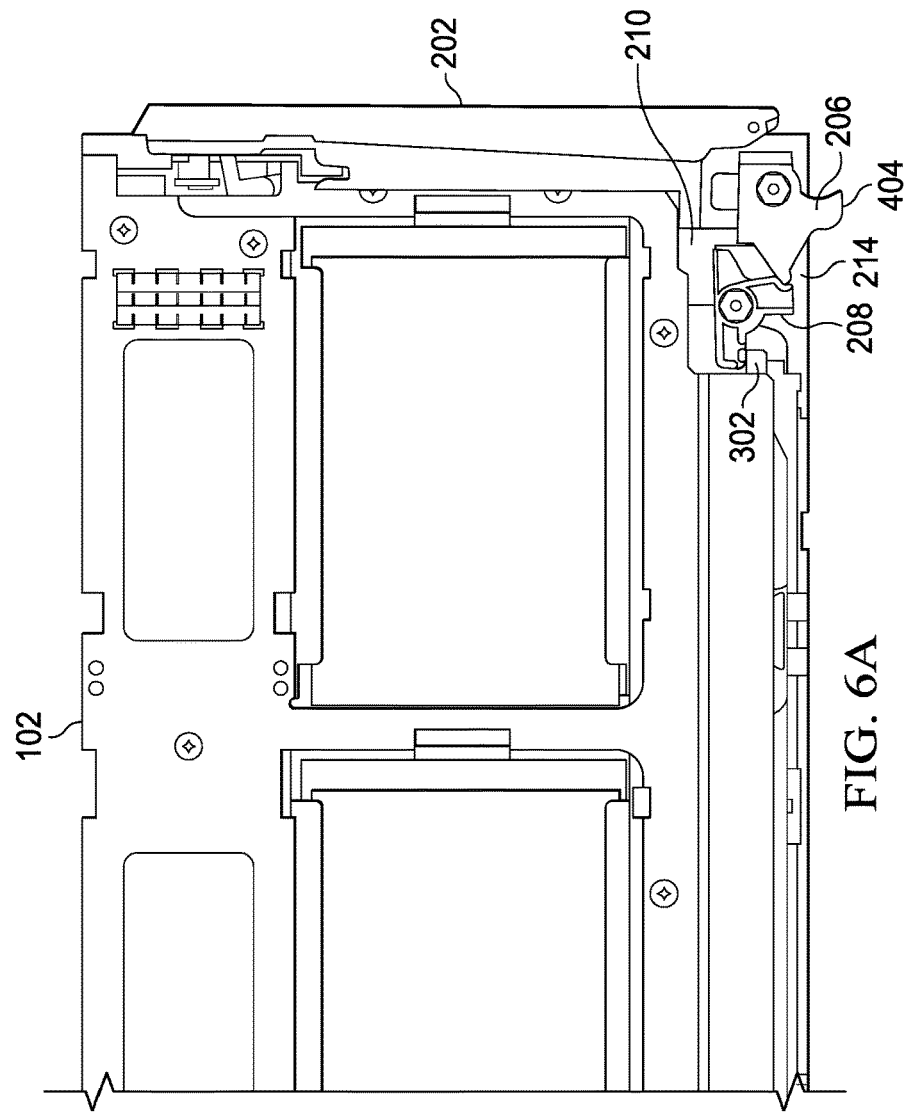

LEVER RELEASE MECHANISM FOR INFORMATION HANDLING SYSTEM CHASSIS SLED

TECHNICAL FIELD

The present disclosure relates to modular information handling systems. More specifically, embodiments of the disclosure provide systems and methods for a lever release mechanism for an information handling system chassis sled.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. In traditional modular systems, information handling resources (including hard disk drives) and their corresponding chassis bays are typically accessed from a side of the chassis in which the information handling resources may be added or removed. However, because access may be limited to the periphery of the chassis, such an architecture may limit the density of modular components that may be disposed in a chassis.

Accordingly, a chassis may be configured to receive a sled for carrying information handling resources wherein the information handling resources may be accessed from the sides of the sled. However, one component of such a sled that may limit component density is a lever to assist a user in applying sufficient force to engage and disengage the sled from the chassis.

SUMMARY

In accordance with the teachings of the present disclosure, the disadvantages and problems associated with traditional approaches to providing a handle for a chassis sled carrying modular information handling resources in a chassis have been substantially reduced or eliminated.

In accordance with embodiments of the present disclosure, a chassis sled for carrying information handling resources may include a sled housing, a lever mechanically coupled to the sled housing and for aiding a user in engaging the chassis sled with and disengaging the chassis sled from a chassis, and a lever release mechanism mechanically coupled to the lever and the sled housing. The lever release mechanism may be configured to facilitate rotatable translation of the lever relative to the sled housing between a closed position and an open position and vice versa and in the closed position, slidably translate the lever between an unsecured position and a secured position and vice versa.

In accordance with these and other embodiments of the present disclosure, a method may include mechanically coupling a lever to a sled housing of a chassis sled for carrying information handling resources, the lever for aiding a user in engaging the chassis sled with and disengaging the chassis sled from a chassis and mechanically coupling a lever release mechanism to the lever and the sled housing such that the lever release mechanism is configured to facilitate rotatable translation of the lever relative to the sled housing between a closed position and an open position and vice versa and in the closed position, slidably translate the lever between an unsecured position and a secured position and vice versa.

In accordance with these and other embodiments of the present disclosure, an information handling system may include a chassis and a chassis sled for carrying information handling resources comprising a sled housing, a lever mechanically coupled to the sled housing and for aiding a user in engaging the chassis sled with and disengaging the chassis sled from the chassis, and a lever release mechanism mechanically coupled to the lever and the sled housing. The lever release mechanism may be configured to facilitate rotatable translation of the lever relative to the sled housing between a closed position and an open position and vice versa, and in the closed position, slidably translate the lever between an unsecured position and a secured position and vice versa.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 6A and 6B illustrate various views of selected components of an example chassis sled at the end a process for engaging the chassis sled with a chassis at a point in which a lever is returned to a secured position, in accordance with embodiments of the present disclosure.

DETAILED DESCRIPTION

Preferred embodiments and their advantages are best understood by reference to FIGS. 1-6B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
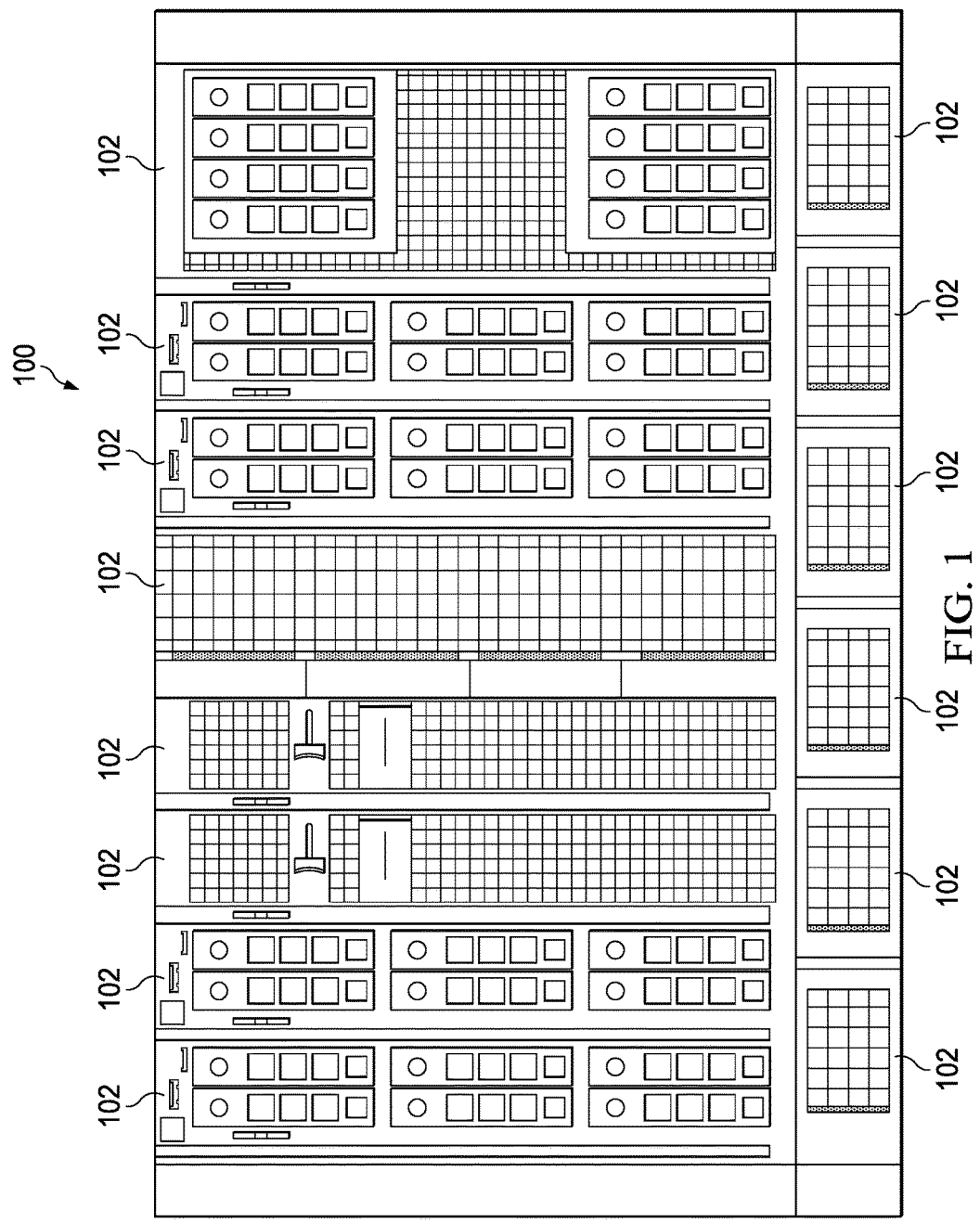
FIG. 1 illustrates a front view of a chassis for receiving modular information handling resources, in accordance with embodiments of the present disclosure.
Figure 2:
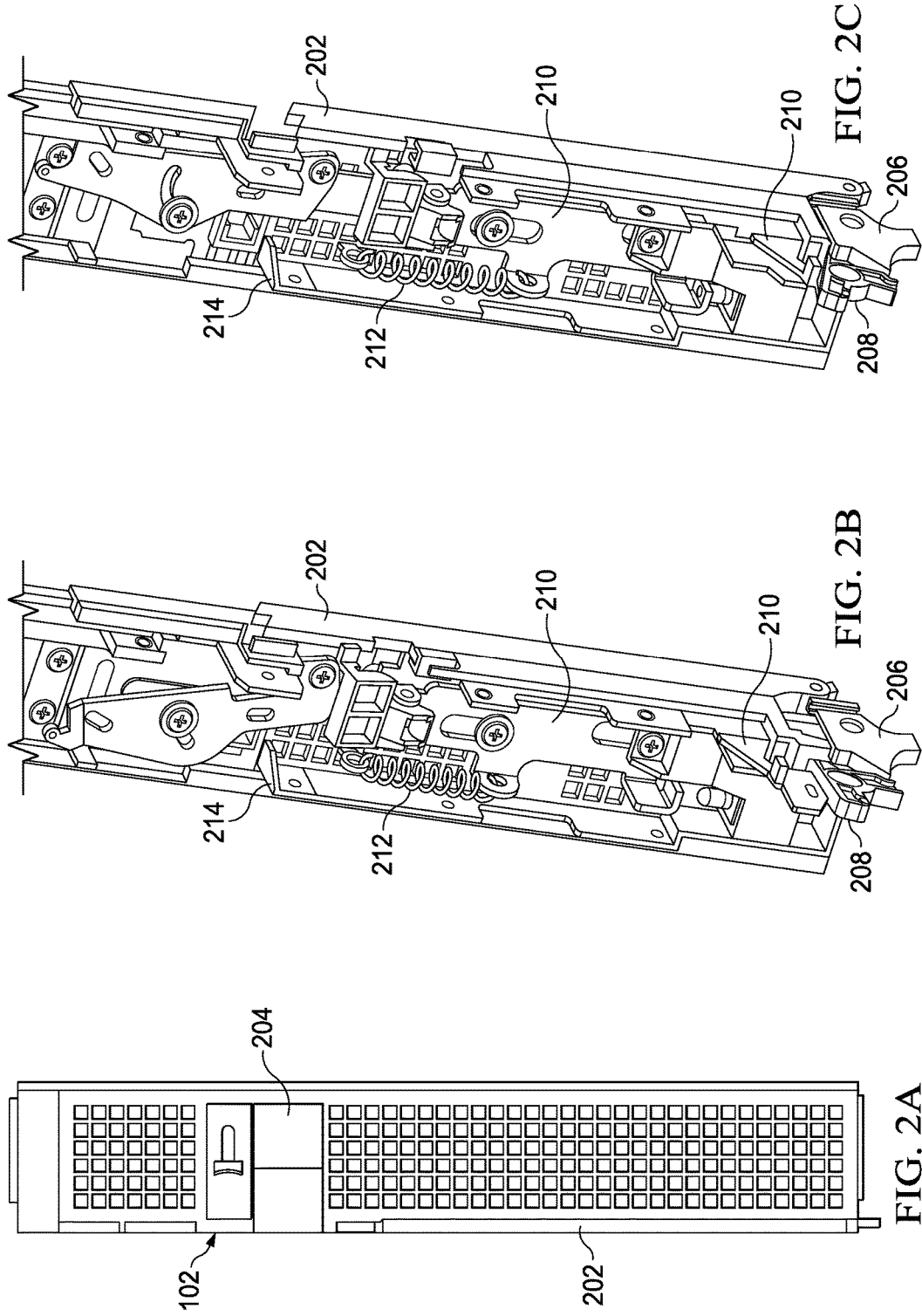
FIGS. 2A-2C illustrate various views of selected components of a lever release mechanism of an example chassis sled, in accordance with embodiments of the present disclosure.

FIG. 1 illustrates a front view of a chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more sleds 102 for receiving information handling resources, as described in greater detail below.

FIGS. 2A-2C illustrate various views of a selected components of a lever release mechanism of an example chassis sled 102, in accordance with embodiments of the present disclosure. FIG. 2A shows a front view of the lever release mechanism with lever 202 in an unsecured position, FIG. 2B shows a rear perspective view of the lever release mechanism with lever 202 in a secured position, and FIG. 2C shows a rear perspective view of the lever release mechanism with lever 202 in an unsecured position.

As shown in FIG. 2A, chassis sled 102 may include a sled release door 204 which may be opened to reveal a release for releasing lever 202 from its secured position, thus permitting a user to engage with (e.g., pull on) the lever in order to remove chassis sled 102 from chassis 100.

As shown in FIGS. 2B and 2C, the lever release mechanism of chassis sled 102 may include lever 202, a sled cam 206 rotatably coupled to a housing 214 of chassis sled 102 and configured to mechanically couple to lever 202, a locking cam 208 rotatably coupled to housing 214 and mechanically coupled to sled cam 206, an internal linking member 210 slidably coupled to housing 214 and configured to mechanically couple to locking cam 208, and a spring 212 mechanically coupled between internal linking member 210 and housing 214. As shown in FIG. 2B, when lever 202 is in its secured position, lever 202 may be disengaged from (e.g., mechanically decoupled from) sled cam 206 and internal linking member 210 may be disengaged from (e.g., mechanically decoupled from) locking cam 208. In addition, when lever 202 is in its secured position, lever 202 may be engaged with (e.g., mechanically coupled to) internal linking member 210. Accordingly, because spring 212 may be biased to compress, in the absence of a force counteracting the force of spring 212, linking member 210 may be biased by spring 212 into a position that in turn, biases lever 202 in its secured position.

To counteract the compressive biasing force of spring 212, a user may open sled release door 204 and interact with a release (not explicitly shown) mechanically coupled to internal linking member 210. By interacting with such release, the user may cause internal linking member 210 to translate in a direction opposite to the compressive biasing force of spring 212 (e.g., downward in FIGS. 2B and 2C), which in turn causes lever 202, which is engaged with internal linking member 210, to also translate in a direction opposite to the compressive biasing force of spring 212. When internal linking member 210 and lever 202 are translated a sufficient distance in the direction opposite to the compressive biasing force of spring 212, internal linking member 210 may disengage from lever 202 and engage with locking cam 208, thus "locking" internal linking member 210 in position to locking cam 208 with a force offsetting the compressive biasing force of spring 212 so that spring 212 remains "stretched." In addition, when internal linking member 210 and lever 202 are translated a sufficient distance in the direction, lever 202 may engage with sled cam 206. Once in its unsecured position, lever 202 may be used by a user to remove chassis sled 102 from chassis 100 (e.g., for servicing) and then later used to re-insert chassis sled 102 into chassis 100 as described in greater detail below and depicted in FIGS. 3-6B.

Figure 3:
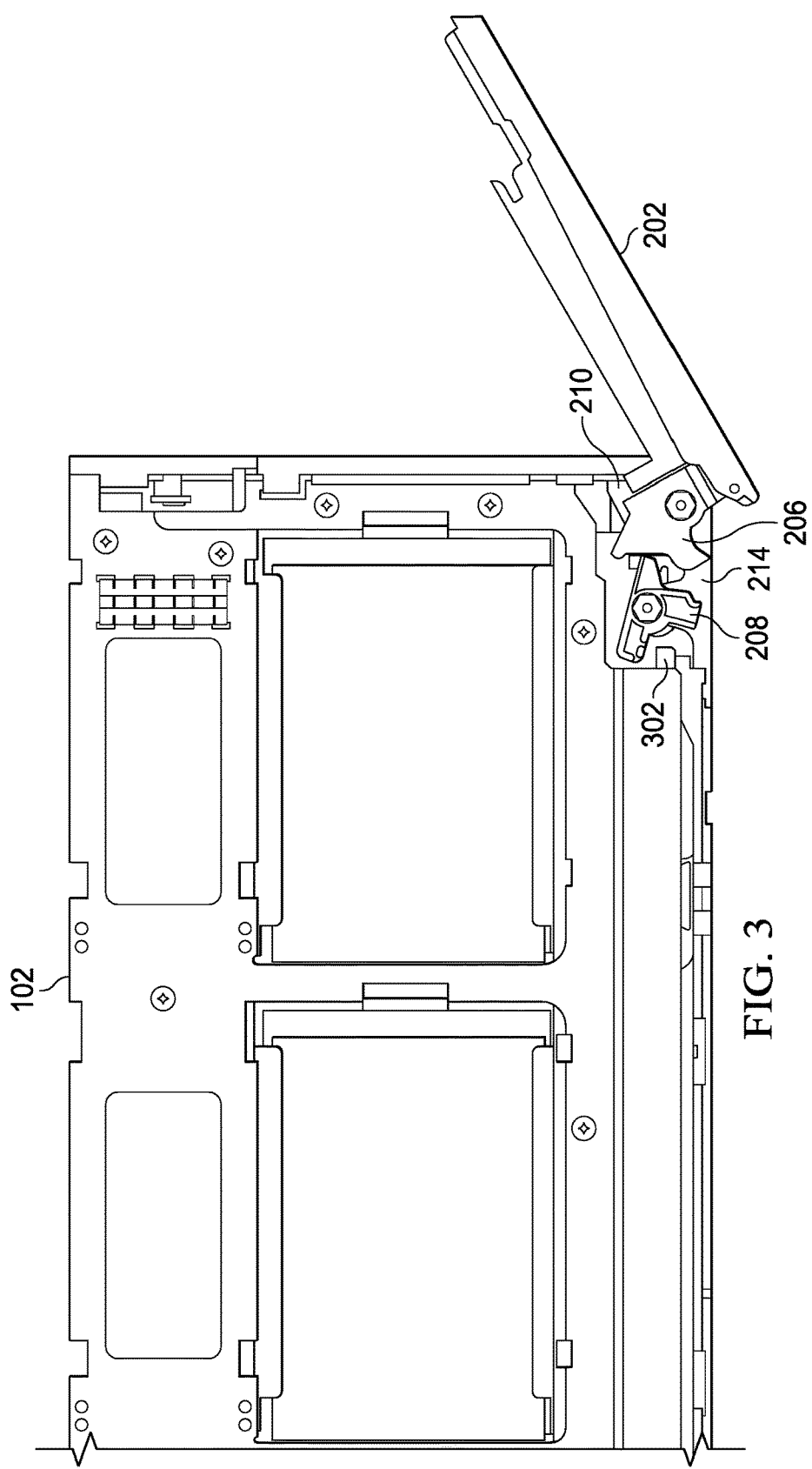
FIG. 3 illustrates a side view of selected components of an example chassis sled at a beginning of a process for engaging the chassis sled with a chassis, in accordance with embodiments of the present disclosure.
Figure 4:
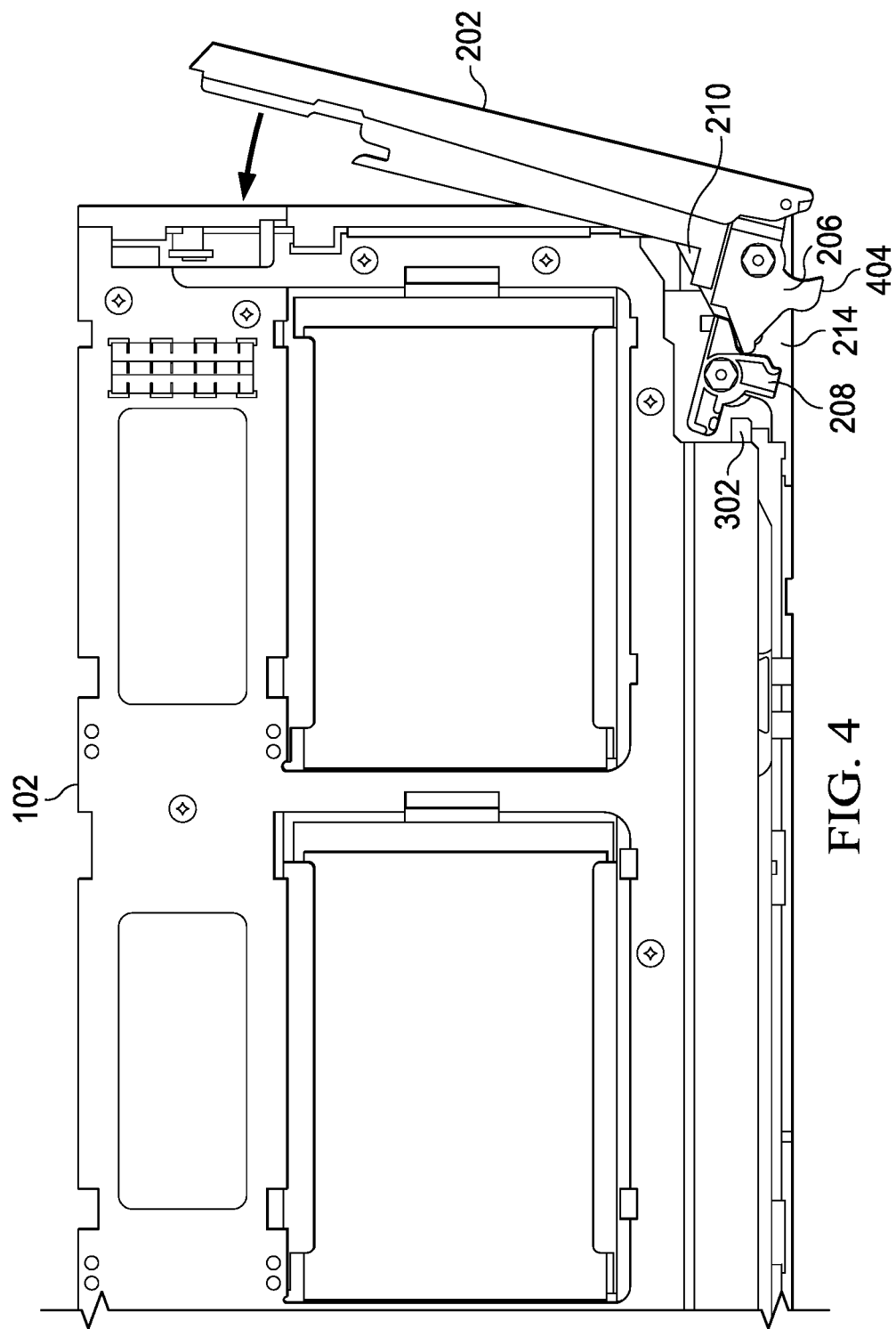
FIG. 4 illustrates a side view of selected components of an example chassis sled during a process for engaging the chassis sled with a chassis, in accordance with embodiments of the present disclosure.
Figure 5B:
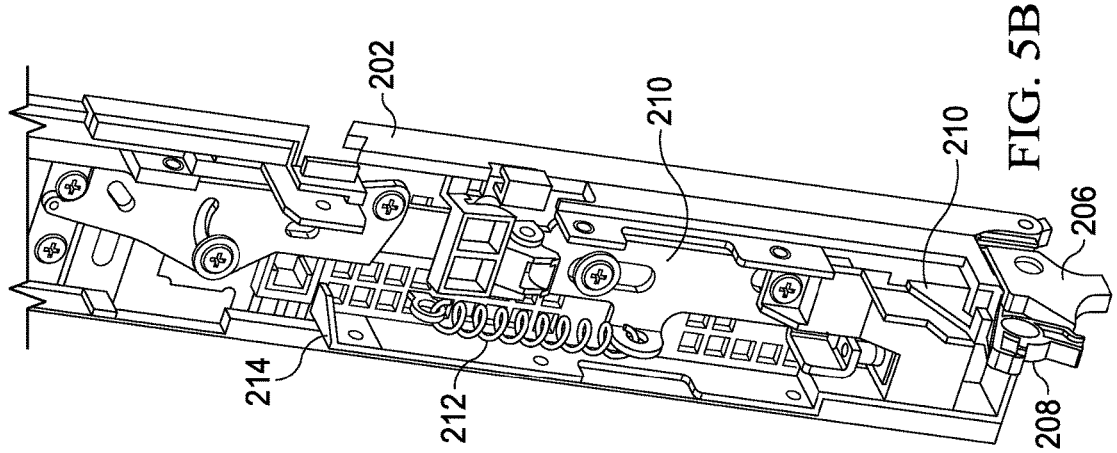
FIGS. 5A and 5B illustrate various views of selected components of an example chassis sled during a process for engaging the chassis sled with a chassis at a point in which a lever is seated in a chassis, in accordance with embodiments of the present disclosure.
Figure 5A:
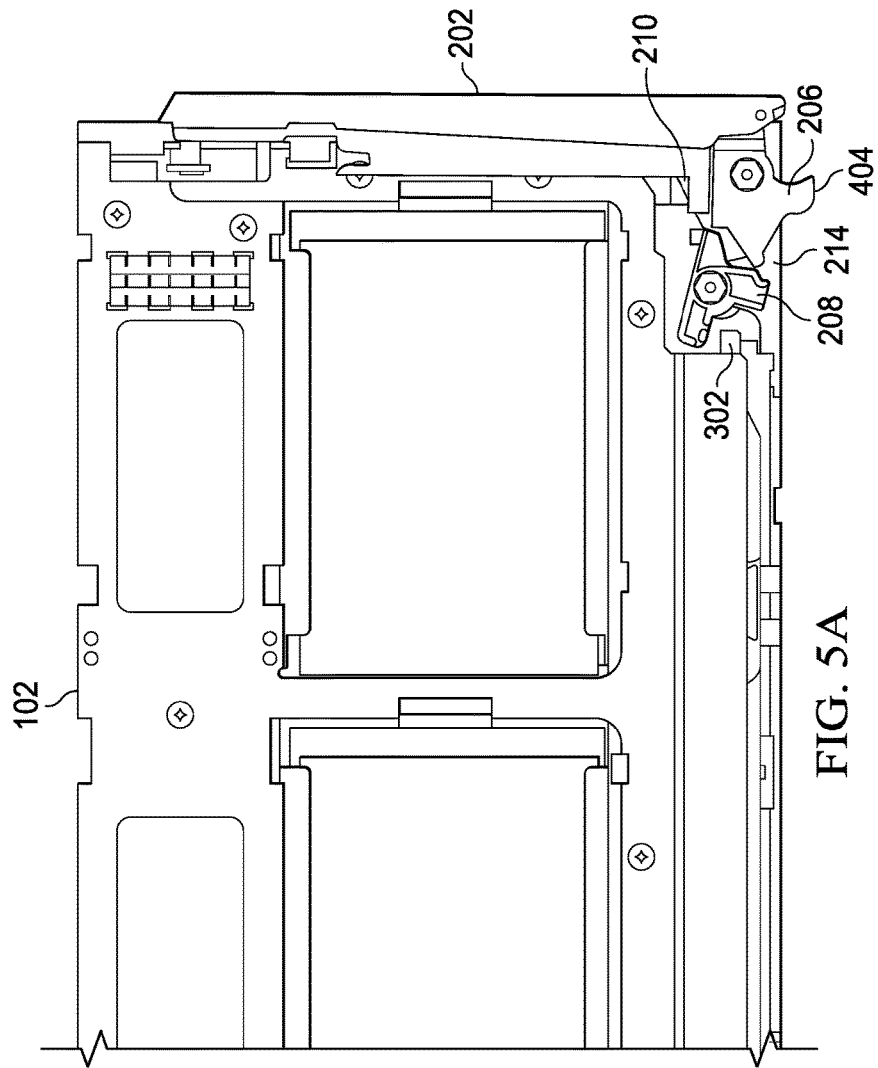

FIGS. 3-6B illustrate views of selected components of chassis sled 102 during a process for engaging chassis sled 102 with chassis 100, in accordance with embodiments of the present disclosure. As shown in FIGS. 3 and 4, as chassis sled 102 is inserted by a user into chassis 100, the user may interact with lever 202 to rotate lever 202 from an open position (e.g., lever 202 angled with respect to the front of chassis sled 102) to a closed position (e.g., lever 202 "flat" with respect to the front of chassis sled 102 as shown in FIGS. 5A and 5B). During insertion, sled cam 206 together with lever 202 may assist a user in overcoming mating and seating forces of chassis sled 102 with chassis 100. For example, sled cam 206 may include a feature 404 that may interact with a corresponding feature (not shown) of chassis 100 to apply force to seat chassis sled 102 into chassis 100 and to mechanically retain chassis sled 102 in chassis 100.

As shown in FIGS. 3-6B, during such insertion, as the user rotates lever 202, sled cam 206 which is engaged with lever 202, may rotate relative to housing 214 causing locking cam 208 to rotate relative to housing 214 which may release locking cam 208 from sled cam 206, allowing locking cam 208 to return to a spring-biased position under a spring force of a spring 302 mechanically coupled between locking cam 208 and housing 214. Once returned to its spring-biased position, locking cam 208 may lock sled cam 206 into position, allowing feature 404 of sled cam 206 to remain engaged with a corresponding feature of chassis 100 to mechanically retain chassis sled 102 within chassis 100.

Also during such insertion, locking cam 208 may rotate to a position such that it disengages from internal linking member 210 and lever 202 may rotate such that it engages with internal linking member 210. Accordingly, as depicted in FIGS. 5A-6B, once locking cam 208 is disengaged from internal linking member 210 and lever 202 is engaged with internal linking member 210, the force applied by locking cam 208 to internal linking member 210 which offsets the compressive biasing force of spring 212 may be removed, and spring 212 may compress, causing internal linking member 210 to translate in a direction of the compressive spring force, in turn causing lever 202 to translate from its unsecured position to its secured position. When lever 202 translates from its unsecured position to its secured position, lever 202 may disengage from sled cam 206.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A chassis sled for carrying information handling resources, comprising:
   a sled housing;
   a lever mechanically coupled to the sled housing and for aiding a user in engaging the chassis sled with and disengaging the chassis sled from a chassis; and
   a lever release mechanism mechanically coupled to the sled housing and including the lever, the lever release mechanism configured to:
      facilitate rotatable translation of the lever relative to the sled housing between a closed position and an open position and vice versa; and
      in the closed position, slidably translate the lever between an unsecured position and a secured position and vice versa;
   wherein the lever release mechanism further comprises an internal linking member slidably coupled to the sled housing; and
   wherein the lever release mechanism further comprises a locking cam rotatably coupled to the sled housing and configured to, responsive to the lever being slidably translated from the secured position to the unsecured position, mechanically engage with the internal linking member such that the internal linking member is configured to disengage from the lever.

2. The chassis sled of claim 1, wherein the lever release mechanism is configured to cause the lever to slidably translate between the unsecured position and the secured position responsive to the lever being rotatably translated between the open position and the closed position.

3. The chassis sled of claim 1, wherein the lever release mechanism comprises a spring mechanically coupled to the sled housing and configured to cause the lever to slidably translate between the unsecured position and the secured position responsive to the lever being rotatably translated between the open position and the closed position.

4. The chassis sled of claim 3, wherein the internal linking member is mechanically coupled to the spring and configured to: mechanically disengage from the lever prior to translation of the lever from the closed position to the open position; and responsive to the lever being rotatably translated between the open position and the closed position, engage with the lever such that a spring force of the spring causes the lever to slidably translate between the unsecured position and the secured position.

5. The chassis sled of claim 1, wherein the lever release mechanism further comprises a sled cam rotatably coupled to the sled housing and configured to engage with the lever when the lever is in the unsecured position and the open position to facilitate rotation of the lever between the open position and the closed position and vice versa.

6. The chassis sled of claim 5, wherein the sled cam is further configured to mechanically engage with the chassis responsive to rotation of the lever from the open position to the closed position in order to maintain the chassis sled within the chassis.

7. A method comprising:
   mechanically coupling a lever to a sled housing of a chassis sled for carrying information handling resources, the lever for aiding a user in engaging the chassis sled with and disengaging the chassis sled from a chassis; and mechanically coupling a lever release mechanism to the sled housing such that the lever release mechanism is configured to:
  facilitate rotatable translation of the lever relative to the sled housing between a closed position and an open position and vice versa; and
  in the closed position, slidably translate the lever between an unsecured position and a secured position and vice versa;
wherein the lever release mechanism further comprises an internal linking member slidably coupled to the sled housing; and
wherein the lever release mechanism further comprises a locking cam rotatably coupled to the sled housing and configured to, responsive to the lever being slidably translated from the secured position to the unsecured position, mechanically engage with the internal linking member such that the internal linking member disengages from the lever.

8. The method of claim 7, wherein the lever release mechanism is configured to cause the lever to slidably translate between the unsecured position and the secured position responsive to the lever being rotatably translated between the open position and the closed position.

9. The method of claim 7, wherein the lever release mechanism comprises a spring mechanically coupled to the sled housing and configured to cause the lever to slidably translate between the unsecured position and the secured position responsive to the lever being rotatably translated between the open position and the closed position.

10. The method of claim 9, wherein the internal linking member is mechanically coupled to the spring and configured to: mechanically disengage from the lever prior to translation of the lever from the closed position to the open position; and responsive to the lever being rotatably translated between the open position and the closed position, engage with the lever such that a spring force of the spring causes the lever to slidably translate between the unsecured position and the secured position.

11. The method of claim 7, wherein the lever release mechanism further comprises a sled cam rotatably coupled to the sled housing and configured to engage with the lever when the lever is in the unsecured position and the open position to facilitate rotation of the lever between the open position and the closed position and vice versa.

12. The method of claim 11, wherein the sled cam is further configured to mechanically engage with the chassis responsive to rotation of the lever from the open position to the closed position in order to maintain the chassis sled within the chassis.

13. An information handling system comprising:
a chassis; and
a chassis sled for carrying information handling resources, comprising:
  a sled housing;
  a lever mechanically coupled to the sled housing and for aiding a user in engaging the chassis sled with and disengaging the chassis sled from the chassis; and
  a lever release mechanism mechanically coupled to the sled housing, the lever release mechanism configured to:
    facilitate rotatable translation of the lever relative to the sled housing between a closed position and an open position and vice versa;
    in the closed position, slidably translate the lever between an unsecured position and a secured position and vice versa;
  wherein the lever release mechanism further comprises an internal linking member slidably coupled to the sled housing; and
  wherein the lever release mechanism further comprises a locking cam rotatably coupled to the sled housing and configured to, responsive to the lever being slidably translated from the secured position to the unsecured position, mechanically engage with the internal linking member such that the internal linking member is configured to disengage from the lever.

14. The information handling system of claim 13, wherein the lever release mechanism is configured to cause the lever to slidably translate between the unsecured position and the secured position responsive to the lever being rotatably translated between the open position and the closed position.

15. The information handling system of claim 13, wherein the lever release mechanism comprises a spring mechanically coupled to the sled housing and configured to cause the lever to slidably translate between the unsecured position and the secured position responsive to the lever being rotatably translated between the open position and the closed position.

16. The information handling system of claim 15, wherein the internal linking member is mechanically coupled to the spring and configured to: mechanically disengage from the lever prior to translation of the lever from the closed position to the open position; and responsive to the lever being rotatably translated between the open position and the closed position, engage with the lever such that a spring force of the spring causes the lever to slidably translate between the unsecured position and the secured position.

17. The information handling system of claim 13, wherein the lever release mechanism further comprises a sled cam rotatably coupled to the sled housing and configured to engage with the lever when the lever is in the unsecured position and the open position to facilitate rotation of the lever between the open position and the closed position and vice versa.

18. The information handling system of claim 17, wherein the sled cam is further configured to mechanically engage with the chassis responsive to rotation of the lever from the open position to the closed position in order to maintain the chassis sled within the chassis.

* * * * *